(12) United States Patent
Matsumoto et al.

(10) Patent No.: US 8,102,726 B2
(45) Date of Patent: Jan. 24, 2012

(54) SEMICONDUCTOR DEVICE

(75) Inventors: Yasuhiro Matsumoto, Tokyo (JP); Yasuji Koshikawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 596 days.

(21) Appl. No.: 12/318,417

(22) Filed: Dec. 29, 2008

(65) Prior Publication Data

US 2010/0124134 A1     May 20, 2010

(30) Foreign Application Priority Data

Nov. 17, 2008  (JP) .............................. P2008-293349

(51) Int. Cl.
*G11C 7/02* (2006.01)
(52) U.S. Cl. ...................................... 365/207; 365/214
(58) Field of Classification Search .................. 365/207, 365/214
See application file for complete search history.

(56) References Cited

U.S. PATENT DOCUMENTS

| | | | |
|---|---|---|---|
| 5,418,749 A | * | 5/1995 | Suda et al. .................... 365/203 |
| 6,046,924 A | | 4/2000 | Isobe et al. |
| 2003/0206472 A1 | * | 11/2003 | Hidaka et al. ................. 365/205 |
| 2008/0013358 A1 | * | 1/2008 | Ooishi ............................ 365/63 |

FOREIGN PATENT DOCUMENTS

JP          2000-77628 A       3/2000

* cited by examiner

*Primary Examiner* — Tuan T. Nguyen
(74) *Attorney, Agent, or Firm* — McGinn IP Law Group, PLLC

(57) ABSTRACT

A semiconductor device includes a plurality of memory cells and a sense amplifier circuit which further includes a plurality of elements such as MOS transistor formed in a well, wherein sensitive element, which are sensitive to dispersion of an impurity density in the well, is distanced from a boundary and are disposed in the center region of the well, while non-sensitive element is disposed in the peripheral region close to the boundary in the well. Since sensitive element requiring precise control of threshold voltage is disposed in the center region having uniform impurity density, and non-sensitive element allowing for less precise control of threshold voltage is disposed in the peripheral region suffering from uneven impurity density, it is possible to effectively use the overall area of the well and to thereby suppress an increase in the layout area of chips.

11 Claims, 8 Drawing Sheets

FIG. 6A  WL 
FIG. 6B  BLT BLB 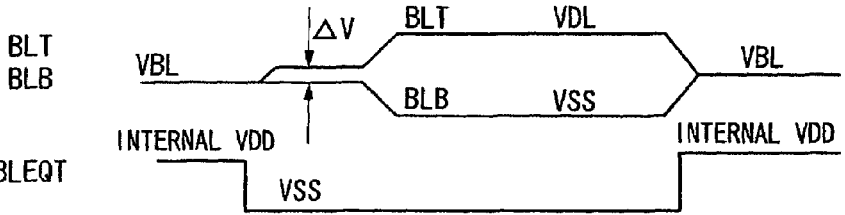
FIG. 6C  BLEQT 
FIG. 6D  COLUMN SELECT SIGNAL 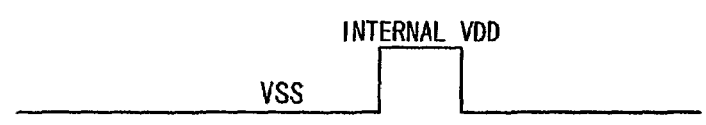
FIG. 6E  LIO /LIO 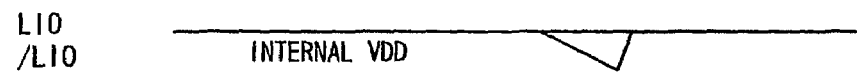

SEMICONDUCTOR DEVICE

BACKGROUND OF THE INVENTION

1. Field of the Invention

The present invention relates to semiconductor devices and in particular, a decrease in negative influences on the semiconductor device's performance due to dispersion of impurity density in a process for the manufacture of the semiconductor devices.

The present application claims priority on Japanese Patent Application No. 2008-293349, the content of which is incorporated herein by reference.

2. Description of Related Art

Dynamic random-access memories (DRAM) are constituted of memory cells, each of which is configured of a single capacitor for accumulating data and a single switching transistor for reading and writing data with the capacitor.

Progressing highly integrated structures of memories reduces the amount of charges accumulated in capacitors so as to reduce magnitudes of signals read from capacitors by switching transistors; hence, they require sense amplifiers to amplify signals having small voltages. This technology has been developed and disclosed in various documents such as Patent Document 1.

Patent Document 1: Japanese Unexamined Patent Application Publication No. 2000-77628

FIG. 5 shows an example of a sense amplifier circuit including a pair of sense amplifiers located between adjacent memory cells included in a sub-cell array.

Specifically, a sense amplifier (which is coupled with a memory cell located in the left side of FIG. 5) is constituted of a pair of n-channel MOS transistors (hereinafter, referred to as NMOS transistors) 2-N4a and 2-N5a and a pair of p-channel MOS transistors (hereinafter, referred to as PMOS transistors) 2-P1a and 2-P2a.

In connection with the above sense amplifier, an NMOS transistor 2-N1a is used to equalize bit lines BLTa and BLBa to the same potential, while NMOS transistors 2-N6a and 2-N7a are used to precharge the bit lines BLTa and BLBa.

Another sense amplifier (which is coupled with another memory cell located in the right side of FIG. 5) is constituted of NMOS transistors 2-N4b and 2-N5b and PMOS transistors 2-P1b and 2-P2b.

In connection with the above sense amplifier, an NMOS transistor 2-N1b is used to equalize bit lines BLTb and BLBb to the same potential, while NMOS transistors 2-N6b and 2-N7b are used to precharge the bit lines BLTb and BLBb.

Next, the operation of the sense amplifier circuit of FIG. 5 will be described with reference to FIGS. 6A to 6E, which show a read operation for reading data "1" from the memory cell coupled with the bit line BLTa.

A precharge voltage VBL (e.g. 0.6 V) is applied to a signal line LVBL while a BL-equalize-MOS-activate signal having a high level (corresponding to an internal drive voltage VDD, e.g. 1.4 V) is applied to the gates of the NMOS transistors 2-N1a, 2-N6a, and 2-N7a via a signal line BLEQT. In this state, the NMOS transistors 2-N1a, 2-N6a, and 2-N7a are turned on so as to equalize the bit lines BLTa and BLBa to the precharge voltage VBL. At this time, the drive voltage is stopped to be supplied to nodes SA-N-MOS and SA-P-MOS, which are thus equalized with the precharge voltage VBL.

When the BL-equalize-MOS-activate signal applied to the signal line BLEQT is turned to a low level (corresponding to a ground potential VSS, e.g. 0 V), the NMOS transistors 2-N1a, 2-N6a, and 2-N7a are turned off, thus resetting the bit lines BLTa and BLBa to an open state.

When a word line WL coupled with the memory cell is activated at a high level (corresponding to VPP, e.g. 2.7 V), a charge accumulated in a capacitor of the memory cell is transferred onto the bit line BLTa, thus increasing the potential of the bit line BLTa by $\Delta V$ in response to charge transfer.

Since the potential of the bit line BLBa is maintained at the precharge voltage VBL, a potential difference $\Delta V$ occurs between the bit lines BLTa and BLBa.

Due to a drive voltage applied to the sense amplifier circuit, the node SA-N-MOS is set to the ground potential VSS while the node SA-P-MOS is set to VDL (e.g. 1.2 V). Compared to the PMOS transistor 2-P2a whose gate is connected to the bit line BLTa, the PMOS transistor 2-P1a whose gate is connected to the bit line BLBa is firstly turned on with a small on-resistance due to a decrease of the potential difference $\Delta V$.

Compared to the NMOS transistor 2-N4a whose gate is connected to the bit line BLBa, the NMOS transistor 2-N5a whose gate is connected to the bit line BLTa is firstly turned on with a small on-resistance due to an increase of the potential difference $\Delta V$.

This increases the potential of the bit line BLTa while decreasing the potential of the bit line BLBa, so that the potential of the bit line BLTa will reach VDL while the potential of the bit line BLBa will reach VSS, thus completing the operation of the sense amplifier.

Thereafter, a column-select signal is set to a high level so that the potential of the bit line BLTa is transferred onto a local IO line LIOTa while the potential of the bit line BLBa is transferred onto a local IO line LIOBa.

This completes the read operation for reading data from the memory cell. In order to subsequently read data from the memory cell, the BL-equalize-MOS-activate signal having a high level is supplied to the gates of the NMOS transistors 2-N1a, 2-N6a, and 2-N7a via the signal line BLEQT, thus equalizing the bit lines BLTa and BLBa with the precharge voltage VBL. This makes it possible to subsequently read data from the memory cell.

The present inventors have recognized the following drawbacks and their causes with respect to the sense amplifier circuit of FIG. 5.

Since the sense amplifier constituted of the PMOS transistors 2-P1a and 2-P2a and the NMOS transistors 2-N4a and 2-N5a amplifies the potential difference $\Delta V$ between the bit lines BLTa and BLBa in the read operation for reading data from the memory cell, a difference of threshold voltage Vth between the PMOS transistors 2-P1a and 2-P2a and a difference of threshold voltage Vth between the NMOS transistors 2-N4a and 2-N5a should be substantially smaller than the potential difference $\Delta V$.

When the difference of the threshold voltage Vth between the paired. PMOS transistors and the difference of threshold voltage Vth between the paired NMOS transistors are larger than the potential difference $\Delta V$, the sense amplifier cannot perform amplification based on the potential difference $\Delta V$ so as to fail to read data from the memory cell.

For this reason, the sense amplifier circuit of FIG. 5 must be designed to precisely set the threshold voltages Vth of the MOS transistors forming the sense amplifiers.

FIG. 7 shows a layout of the sense amplifier circuit of FIG. 5, wherein an n-type well NW1 is sandwiched between p-type wells PW1 and PW2 and wherein the PMOS transistors 2-P1a, 2-P1b, 2-P2a, and 2-P2b forming the sense amplifiers are formed in the n-type well NW1.

For the sake of convenience, FIG. 7 does not include illustrations of elements other than the N-type well NW1, the P-type wells PW1 and PW2 as well as gate wiring layers and diffusion layers forming sources and drains of transistors.

In the actuality, numerous sense amplifier circuits (each shown in FIG. 7) are linearly aligned (Y-direction in FIG. 7) such that both ends of the sense amplifier circuits serve as dummy sense amplifier circuits.

In the fabrication of the wells in FIG. 7, ions of p-type impurities are implanted into a semiconductor substrate (not shown) so as to form a p-type well PW, and then ions of n-type impurities are implanted into the semiconductor substrate so as to form the n-type well NW1, thus dividing the p-type well PW into the p-type wells PW1 and PW2. In this process shown in FIG. 8, a photoresist is formed on the entire surface of a wafer and is then removed from the prescribed region used for the formation of the n-type well NW1; thereafter, n-type impurities are doped into the prescribed region.

The NMOS transistors of the sense amplifier circuit are formed in the p-type wells PW1 and PW2, while the PMOS transistors are formed in the n-type well NW1.

The present inventors checked the operation of the sense amplifier circuit (which is actually produced with the constitution shown in FIGS. 5 and 7) so as to discover that the read operation may not be always performed with the expected performance. To solve such a drawback, the present inventors analyzed device characteristics so as to find out dispersions regarding the threshold voltages Vth of the transistors forming the sense amplifiers, in particular, relatively large dispersions regarding the threshold voltages Vth of the PMOS transistor 2-P1a and 2-P1b.

The inventors further analyzed the causes of dispersions of threshold voltages Vth so as to assert that the PMOS transistors 2-P1a and 2-P2a (forming the sense amplifier) and the PMOS transistors 2-P1b and 2-P2b (forming another sense amplifier) are linearly aligned in the n-type well NW1.

In the linear alignment, n-type impurities used for the formation of the n-type well NW1 are implanted for the side wall of the photoresist with a certain angle; hence, they may be reflected at the side wall or its proximate portion of the photoresist, or they may not properly implanted into the prescribed region so as to form ion-implantation-incomplete regions A1 and A2 lying around an ion-implantation-complete region B due to the shade of the photoresist as shown in FIG. 8.

Compared with the region B inside the n-type well NW1, a doped amount of n-type impurities may be dispersed in the regions A1 and A2 (lying in the periphery of the n-type well NW1), which thus have uneven impurity density. That is, the present inventors regard the dispersion of impurity density in the n-type well NW1 as the significant factor causing variations of threshold voltages Vth of the PMOS transistors 2-P1a and 2-P1b.

Due to the disposition of the dummy sense amplifier circuits at both ends of the alignment of numerous sense amplifier circuits, the reflection of n-type impurities and the unwanted formation of ion-implantation-incomplete regions due to the shade of the photoresist may occur in the left and right sides in the horizontal direction (X-direction in FIG. 7) of the n-type well NW1 in FIG. 7. In other words, the sense amplifier circuit may not suffer from negative influences such as the reflection of n-type impurities in the vertical direction (Y-direction in FIG. 7) in which a relatively large distance can be secured between the boundary of the n-type well NW1 and the sense amplifier circuits due to the arrangement of the dummy sense amplifier circuits.

With respect to the left-side sense amplifier in FIG. 7, the PMOS transistor 2-P1a is arranged in the region A1, which is close to the boundary of the n-type well NW1, in comparison with the PMOS transistor 2-P2a arranged in the region B. Due to the arrangement in the region A1, the PMOS transistor 2-P1a must be affected by the reflection of n-type impurities (used for the formation of the n-type well NW1 by way of ion implantation) at the side wall of the photoresist; hence, it must suffer from relatively large dispersion of the threshold voltage Vth and have difficulty in precisely controlling the threshold voltage Vth unless it is formed in the region B. For this reason, the difference of the threshold voltage Vth between the PMOS transistor 2-P1a (formed in the region A1) and the PMOS transistor 2-P2a (formed in the region B) may become larger than the potential difference $\Delta V$, which makes the sense amplifier fail to read data from the memory cell.

With respect to the right-side sense amplifier, the PMOS transistor 2-P1b is arranged in the region A2, which is close to the boundary of the n-type well NW1, in comparison with the PMOS transistor 2-P2b arranged in the region B. Therefore, the PMOS transistor 2-P1b must suffer from relatively large dispersion of the threshold voltage Vth and have difficulty in precisely controlling the threshold voltage Vth. Similar to the left-side sense amplifier, the right-side sense amplifier fails to read data from the memory cell.

When the density of n-type impurities of the region A1 is higher than the density of n-type impurities of the region B in the n-type well NW1, the threshold voltage Vth of the PMOS transistor 2-P1a arranged in the region A1 must become higher than the threshold voltage Vth of the PMOS transistor 2-P2a arranged in the region B. When the difference of the threshold voltage Vth between the PMOS transistors 2-P1a and 2-P2a becomes higher than the potential difference $\Delta V$, the sense amplifier may fail to read data from the memory cell.

Progressing fine structures and low-voltage driving in semiconductor memories further reduces the potential difference $\Delta V$, whereby differences of threshold voltages of paired NMOS transistors and differences of threshold voltages of paired PMOS transistors significantly affect the performance of sense amplifiers; hence, it is necessary to reduce dispersions of threshold voltages.

The PMOS transistors 2-P1a and 2-P1b can be rearranged from the regions A1 and A2, wherein the PMOS transistors 2-P1a and 2-P1b and the PMOS transistors 2-P2a and 2-P2b are formed in the region B, which is substantially distanced from the boundary of the n-type well NW1. However, the overall layout area of chips must be increased by securing the substantial distance between the region B and the boundary of the n-type well NW1. This pushes up the manufacturing cost for manufacturing semiconductor devices having numerous sense amplifier circuits due to high memory capacities.

The above description is referred to negative influences due to unwanted variations of densities of n-type impurities relative to variations of threshold voltages of PMOS transistors forming sense amplifiers. Similar arguments can be repeated with respect to the formation of NMOS transistors in p-type wells doped with p-type impurities, wherein due to deviations of ion implantation during the formation of p-type wells, the densities of p-type impurities must be varied in peripheries of p-type wells. Therefore, it is preferable to rearrange NMOS transistors used for sense amplifiers whose threshold voltages are precisely controlled in prescribed regions which are substantially distanced from boundaries of p-type wells.

Characteristic parameters causing negative influences due to dispersion of impurity density in a well are not limited to threshold voltages of transistors; that is, it is possible to list other characteristic parameters such as inter-channel leakage current of transistor, junction capacitance of diode having junctions in the well, junction leakage current, and breakdown voltages of junction.

SUMMARY

The invention seeks to solve the above problem or to improve upon the problem at least in part.

In one embodiment, there is provided a semiconductor device that includes a sensitive element and a non-sensitive element formed in a first-conductivity-type well, wherein the sensitive element, which is relatively sensitive to dispersion of impurity density of the first-conductivity-type well, is distanced from a boundary of the first-conductivity-type well, and wherein the non-sensitive element, which is not relatively sensitive to dispersion of impurity density of the first-conductivity-type well, is disposed in proximity to a boundary of the first-conductivity-type well.

In the above, sensitive element requiring high-precision controls of threshold voltage is not disposed in the peripheral region suffering from uneven impurity density close to the boundary in the well but is distanced from the boundary and disposed in the center region having uniform impurity density inside the well, wherein the center region is designed to have the prescribed impurity density determined in advance. This prevents unwanted variations of the impurity density inside the well so as to control operational characteristic parameters of sensitive element at a high precision. In addition, non-sensitive elements allowing low-precision control of threshold voltage is disposed in peripheral region suffering from uneven impurity density; thus, it is possible to suppress an increase in the layout area of chips.

BRIEF DESCRIPTION OF THE DRAWINGS

The above features and advantages of the present invention will be more apparent from the following description of certain preferred embodiments taken in conjunction with the accompanying drawings, in which:

FIG. 6A shows potential variations of a word line WL in the memory mat of FIG. 4;

FIG. 6B shows potential variations of bit lines BLT and BLB in the sense amplifier circuit of FIG. 5;

FIG. 6C shows potential variations of a signal line BLEQT in the sense amplifier circuit of FIG. 5;

FIG. 6D shows variations of a column-select signal in the sense amplifier circuit of FIG. 5;

FIG. 6E shows potential variations of a local IO line LIO in the sense amplifier circuit of FIG. 5;

DETAILED DESCRIPTION OF PREFERRED EMBODIMENTS

The present invention will now be described herein with reference to illustrative embodiments. Those skilled in the art will recognize that many alternative embodiments can be accomplished using the teachings of the present invention and that the invention is not limited to the embodiments illustrated for explanatory purposes.

The present invention is directed to a decrease in negative influences on the semiconductor device's performance due to dispersion of impurity density in a process for the manufacture of the semiconductor devices.

Figure 1:
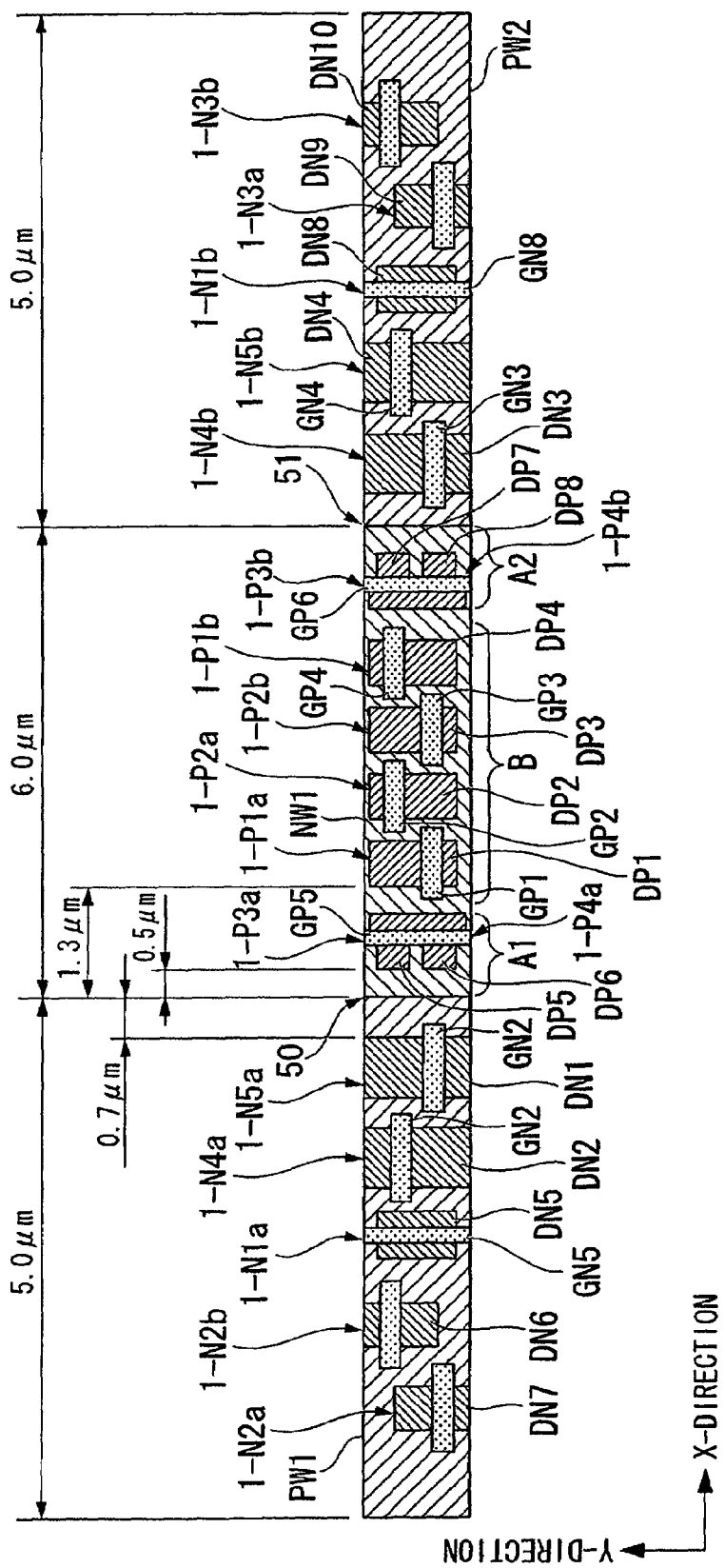
FIG. 1 is a plan view showing the layout of a sense amplifier circuit and its associated elements formed in wells of a semiconductor device serving as a dynamic random-access memory in accordance with the present invention.
Figure 7:
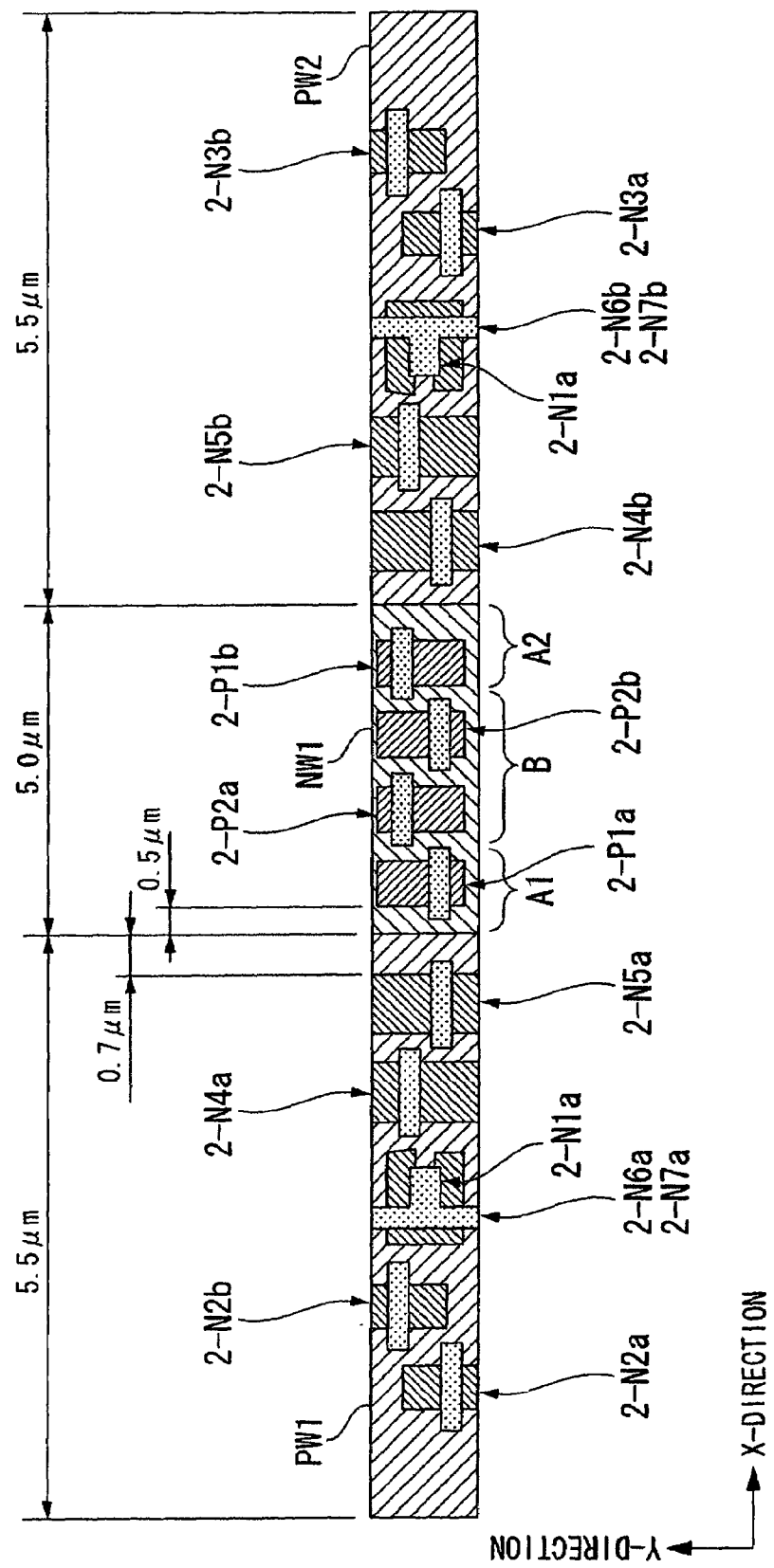
FIG. 7 is a plan view showing a layout of the sense amplifier circuit shown in FIG. 5.

FIG. 1 is a plan view showing the layout of a sense amplifier circuit and its associated elements formed in wells of a sub-cell array of a dynamic random-access memory (DRAM) according to the present embodiment, wherein parts identical to those shown in FIG. 7 are designated by the same reference numerals; hence, the duplicate descriptions thereof are simplified or omitted as necessary.

The following description is given with respect to the countermeasure for coping with uneven density of n-type impurities in the n-type well NW1 (see FIG. 8), which is formed by way of ion implantation using n-type impurities via an opening of the photoresist (or a resist pattern).

The present embodiment is characterized in that PMOS transistors 1-P1a, 1-P-2a, 1-P1b, and 1-P2b used for performing amplification are formed in the region B of the n-type well NW1 (a rectangle) having the uniform impurity density and are distanced from boundaries 50 and 51 of the n-type well NW1 having uneven impurity density. Thus, it is possible to precisely control threshold voltages with respect to the paired PMOS transistors, both of which have substantially the same value of the threshold voltage Vth, thus reducing differences of threshold voltages between the paired PMOS transistors to become smaller than the potential difference $\Delta V$ subjected to amplification. An example of the layout will be described with reference to FIG. 1.

In the block of FIG. 1, the sense amplifier circuit is horizontally elongated along bit lines (X-direction in FIG. 1), whereby numerous sense amplifier circuits are linearly aligned such that both ends of the sense amplifier circuits serve as dummy sense amplifier circuits.

The block of FIG. 1 includes two sense amplifiers SA1 and SA2, MOS transistors of which are linearly aligned along bit lines. This is because, due to a recent tendency for increasing capacities of semiconductor memories, the area of each one memory cell should become smaller so as to correspondingly reduce the pitches between bit lines, whereby the layout should be designed not to increase the widths of sense amplifiers in the vertical direction (Y-direction in FIG. 1) for aligning numerous sense amplifiers in consideration of reduced pitches between bit lines. The alignment of sense amplifiers is formed between adjacent memory mats.

In the n-type well NW1, p-type diffusion layers DP5, DP6, DP1, DP2, DP3, DP4, DP7, and DP8 forming sources and drains of PMOS transistors 1-P1a to 1-P4a and source and drains of PMOS transistors 1-P1b to 1-P4b are linearly aligned in the direction from the left to the right in FIG. 1. In the p-type well PW1 (a rectangle), n-type diffusion layers DN1, DN2, DN5, DN6, and DN7 are linearly aligned in the direction from the right to the left in FIG. 1. In the p-type well PW2 (a rectangle), n-type diffusion layers DN3, DN4, DN8, DN9, and DN10 are linearly aligned in the direction from the left to the right in FIG. 1. The alignment order of the diffusion layers in FIG. 1 corresponds to the alignment order of the MOS transistors in FIG. 2.

In the well configuration of the block for fabricating the sense amplifiers SA1 and SA2, the n-type well NW1 doped with n-type impurities is formed between the p-type wells PW1 and PW2 doped with p-type impurities. The left-side of the p-type well PW1 (which is opposite to the right-side of the p-type well PW1 joining the left-side of the n-type well NW1) joins a boundary of a p-type well (not shown) for fabricating the left-side memory mat. Similarly, the right-side of the p-type well PW2 (which is positioned opposite to the left-side of the p-type well PW2 joining the right-side of the n-type well NW1) joins a boundary of a p-type well (not shown) for fabricating the right-side memory mat.

All the wells are formed by way of the foregoing process, wherein the peripheral regions A1 and A2 (positioned in proximity to the boundaries 50 and 51 of the n-type well NW1) have uneven density of n-type impurities, so that the center portion of the n-type well NW1 (which is distanced from the boundaries 50 and 51) is uniformed in the density of n-type impurities. The uniform density of n-type impurities is established in the region B which is distanced from the boundaries 50 and 51 by approximately 1μ (which is experimentally determined in the present manufacturing process).

The paired PMOS transistors 1-P1a and 1-P2a and the paired PMOS transistors 1-P1b and 1-P2b, which are used to perform sense amplification on potential differences appeared between paired bit lines, are formed inside the region B distanced from the boundaries 50 and 51 in the n-type well NW1. Specifically, the p-type diffusion layers DP1, DP2, DP3, and DP4 doped with p-type impurities as well as channel regions (i.e. gate wiring regions GP1, GP2, GP3, and GP4) are formed in the region B distanced from the boundaries 50 and 51 in the n-type well NW1. In the layout of FIG. 1, the p-type diffusion layer DP1 forming the PMOS transistor 1-P1a is arranged in the region B at the prescribed position which is distanced from the boundary 50 in the n-type well NW1 by 1.3 μm. Similarly, the p-type diffusion layer DP4 forming the PMOS transistor 1-P1b is arranged in the region B at the prescribed position which is distanced from the boundary 51 in the n-type well NW1 by 1.3 μm.

That is, the present embodiment is designed such that transistors, which are used in a sense amplifier and thus precisely controlled in threshold voltages, are not arranged in the regions A1 and A2 having uneven impurity density but in the region B having uniform impurity density in the n-type well NW1. This makes it possible to precisely control threshold voltages of transistors used for the sense amplifier. In other words, the same value of the threshold voltage Vth which may not cause a problem in practical use can be set to the paired transistors used for the sense amplifier circuit; thus, it is possible to produce the sense amplifier circuit capable of precisely sensing and amplifying the small potential difference ΔV occurring between bit lines.

The p-type diffusion layers DP5 and DP6 and the channel region (or gate wiring region) GP5 for use in the PMOS transistors 1-P3a and 1-P4a are formed between the PMOS transistor 1-P1a and the boundary 50 in the n-type well NW1. In addition, the p-type diffusion layers DP7 and DP8 and the channel region (or gate wiring region) GP6 for used in the PMOS transistors 1-P3b and 1-P4b are formed between the PMOS transistor 1-P1b and the boundary 51 in the n-type well NW1.

Uneven impurity density is observed by way of the measurement on the dispersions of threshold voltages Vth of PMOS transistors formed in the regions A1 and A2. This indicates that, even in the regions A1 and A2 which cannot be used for the formation of transistors whose threshold voltages should be precisely controlled, it is possible to form transistors whose threshold voltages are not necessarily precisely controlled and which merely perform a switching function (i.e. on/off functions) for the purpose of precharge of bit lines.

The PMOS transistors 1-P1a, 1-P2a, 1-P1b, and 1-P2b forming the sense amplifiers in the n-type well NW1 are required to precisely control the threshold voltages Vth (or operational characteristic parameters) thereof and are thus regarded as "sensitive" elements which significantly affect the operation of the integrated circuitry due to dispersions of the threshold voltages Vth caused by uneven impurity density in the n-type well NW1. These PMOS transistors forming the sense amplifiers are relatively sensitive to uneven impurity density in the n-type well NW1; hence, these sensitive elements can be formed in the region B distanced from the boundaries 50 and 51 in the n-type well NW1.

The PMOS transistors 1-P3a, 1-P4a, 1-P3b, and 1-P4b for use in precharge of bit lines in the n-type well NW1 are not required to precisely control the threshold voltages Vth (i.e. operational characteristic parameters) thereof and are thus regarded as "non-sensitive" elements which hardly affect the operation of the integrated circuitry due to dispersions of the threshold voltages Vth caused by uneven impurity density in the n-type well NW1. These PMOS transistors are relatively non-sensitive to uneven impurity density in the n-type well NW1; hence, these non-sensitive elements can be formed in the regions A1 and A2 in proximity to the boundaries 50 and 51 in the n-type well NW1.

As operational characteristic parameters of elements easily affected by uneven impurity density in a well other than the threshold voltage Vth of transistor, it is possible to list interchannel current of transistor, junction capacitance of diode whose semiconductor layer having reverse conductivity joins the well, junction leakage current, and breakdown voltage of junction. Elements such as transistors and diodes formed on semiconductor substrates of semiconductor devices can be regarded as either sensitive elements or non-sensitive elements based on the functions thereof.

The present invention is designed based on the basic concept in that, in terms of operational characteristic parameters of elements affected by uneven impurity density of the well of the semiconductor device, sensitive elements, which significantly affect the operation of the semiconductor device, are disposed inside the well distanced from its boundary, while non-sensitive elements, which hardly affect the operation of the semiconductor device, are disposed in proximity to the boundary of the well.

Compared to non-sensitive elements, sensitive elements sensitive to uneven impurity density of the well are affected by deviation of the impurity density of the well so as to affect the operation of the semiconductor device below the expected performance.

Generally speaking, the expected performance of the semiconductor device is classified into functional performance and characteristic performance. The actual products of semiconductor devices must be designed to satisfy both of the functional performance and the characteristic performance. In other words, the alignment of sensitive element and non-sensitive element in the well should be determined to secure margins as large as possible in terms of the functional performance and the characteristic performance.

Based on the concept of the present invention adapted to the sense amplifiers, the regions A1 and A2 which are proximate to the boundaries 50 and 51 in the n-type well NW1 and cannot be used to form transistors requiring precise control of threshold voltages, can be effectively used to form other transistors which do not require precise control of threshold voltages. Thus, it is possible to actualize the sense amplifier circuit capable of precisely reading data without wasting areas and without enlarging the layout area of chips.

In the present embodiment, a pair of the PMOS transistors 1-P3a and 1-P4a for use in precharge of bit lines is formed in the region A1 while a pair of the PMOS transistors 1-P3b and 1-P4b for use in precharge of bit lines is formed in the region A2 in the n-type well NW1. When comparing FIG. 2 to FIG. 5, the paired PMOS transistors 1-P3a and 1-P4a are substituted for the NMOS transistors 2-N6a and 2-N7a for use in precharge of bit lines, and the paired PMOS transistors 1-P3b and 1-P4b are substituted for the NMOS transistors 2-N6b and 2-N7b for use in precharge of bit lines. In other words, the present embodiment is designed to effectively use the regions A1 and A2 of the n-type well NW1 in such a way that the transistors for use in precharge of bit lines are changed from N-channel MOS transistors to P-channel MOS transistors and are disposed in the regions A1 and A2. It is possible to supply the gates of the PMOS transistors for use in precharge of bit lines with inverted signals of the BL-equalize-MOS-activate signals BLEQT (see FIG. 5) whose amplitudes vary between the internal drive voltage VDD (e.g. 1.4 V) and the ground potential VSS (e.g. 0 V).

It is well known that PMOS transistors having the same sizes as NMOS transistors suffer from low current drive performance when they are turned on with a gate voltage corresponding to VSS=0 (V). To cope with such a drawback, it is possible to supply the gates of the PMOS transistors for use in precharge of bit lines with the BL-equalize-MOS-activate signals BLEQT whose amplitudes vary between the internal drive voltage VDD (e.g. 1.4 V) and a negative potential VBB (e.g. −0.5 V) via signal lines BLPRB (see FIG. 2). Since the amplitude between VDD and VBB is larger than the foregoing amplitude between VDD and VSS, it is possible to improve the current drive performance of the PMOS transistors for use in precharge of bit lines even when they are turned on with the gate voltage of VBB=−0.5 (V), thus increasing the precharge speed of bit lines.

Since the PMOS transistors 1-P3a, 1-P4a, 1-P3b, and 1-P4b for use in precharge of bit lines are turned on with the gate voltage of VBB, it is possible to secure a high precharge speed of bit lines irrespective of dispersions of threshold voltages Vth.

As described above, the present embodiment is designed such that compared to the PMOS transistors 1-P3a, 1-P4a, 1-P3b, and 1-P4b for use in precharge of bit lines, the PMOS transistors 1-P1a, 1-P2a, 1-P1b, and 1-P2b included in the sense amplifiers SA1 and SA2 are disposed in the center region of the n-type well NW1 distanced from the boundaries 50 and 51. Since the PMOS transistors 1-P1a, 1-P2a, 1-P1b, and 1-P2b are not disposed in the regions A1 and A2 suffering from uneven impurity density, it is possible to reduce dispersions of threshold voltages Vth thereof, and it is therefore possible to form the sense amplifiers SA1 and SA2 capable of precisely sensing and amplifying the "subtle" potential difference ΔV between bit lines.

In addition, the PMOS transistors 1-P3a, 1-P4a, 1-P3b, and 1-P4b which do not require precise control of threshold voltages are formed in the regions A1 and A2, which are formed between the boundaries 50 and 51 and the region B (which is used to form the PMOS transistors 1-P1a, 1-P2a, 1-P1b, and 1-P2b which require precise control of threshold voltages) in the n-type well NW1. This arrangement effectively uses the regions A1 and A2, which are distanced from the boundaries 50 and 51 via the PMOS transistors 1-P1a, 1-P2a, 1-P1b, and 1-P2b; hence, it is possible to suppress an increase in the layout area of chips.

In other words, a first set of the PMOS transistors 1-P1a, 1-P2a, 1-P1b, and 1-P2b included in the sense amplifiers SA1 and SA2 is collectively disposed in the region B having uniform impurity density, which is distanced from the boundaries 50 and 51 in the n-type well NW1. Since the first set of the PMOS transistors is distanced from the regions A1 and A2 suffering from uneven impurity density, it is possible to achieve precise control of threshold voltages in the region B having uniform impurity density in the n-type well NW1.

Compared to a second set of the PMOS transistors 1-P3a, 1-P3b, 1-P3b, and 1-P4b, the first set of the PMOS transistors requiring high-precision controlling of threshold voltages is substantially distanced from the boundaries 50 and 51 in the n-type well NW1. Since the first set of the PMOS transistors is distanced from the regions A1 and A2 suffering from uneven impurity density located in proximity to the boundaries 50 and 51, it is possible to achieve precise control of threshold voltages in the region B having uniform impurity density in the n-type well NW1.

In the above, the second set of the PMOS transistors is disposed between the first set of the PMOS transistors and the boundaries 50 and 51 in the n-type well NW1. Since the present embodiment allows the second set of the PMOS transistors to be disposed in the regions A1 and A2 suffering from uneven impurity density, it is possible to effectively use the regions A1 and A2 in proximity to the boundaries 50 and 51, thus suppressing an increase in the layout area of chips.

Since the first and second sets of the PMOS transistors are formed in the n-type well NW1, it is possible to apply negative voltages to the gates of the second set of the PMOS transistors. This compensates for dispersions of threshold voltages due to uneven impurity density so as to reduce on-resistances of the second set of the PMOS transistors, thus increasing the current drive performance.

Figure 8:
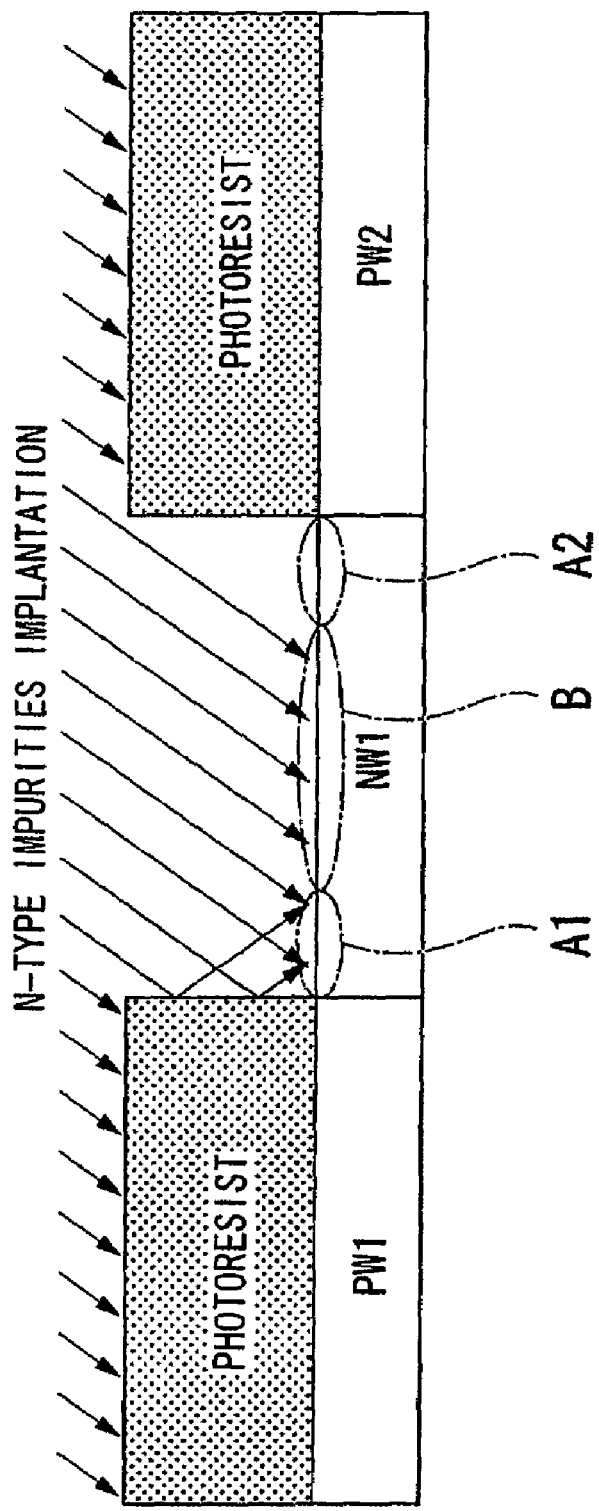
FIG. 8 is an illustration used for explaining ion implantation in the process for forming an n-type well between p-type wells in conjunction with FIG. 7.

In conjunction with FIG. 8, the p-type well PW is formed using ion implantation of p-type impurities and is then divided into the p-type wells PW1 and PW2 by way of the formation of the n-type wall NW1 which is formed via ion implantation of n-type impurities, wherein uneven impurity density of n-type impurities occur in the regions A1 and A2 in proximity to the boundaries 50 and 51 in the n-type well NW1.

Before the ion implantation of p-type impurities, the photoresist is applied to the entire surface and is then subjected to lithography so as to form an opening at the prescribed position, at which p-type impurities are implanted so that uneven impurity density occurs in proximity to the boundaries 50 and 51 in the p-type wells PW1 and PW2. When NMOS transistors are formed in proximity to the boundaries 50 and 51 in the p-type wells PW1 and PW2, threshold voltages thereof cannot be precisely controlled due to the above reason which is described in conjunction with FIG. 8.

Therefore, when NMOS transistors are formed in the process of ion implantation of p-type impurities via the opening of the photoresist, NMOS transistors requiring precise control of threshold voltages, compared to other NMOS transistors allowing relatively large dispersions of threshold voltages, should be distanced from the boundaries 50 and 51 in the p-type wells PW1 and PW2.

In FIG. 1, the NMOS transistors 1-N4a and 1-N5a constituted of the diffusion layers DN1 and DN2 and the channel regions (or gate wiring regions) GN1 and GN2 are distanced from the boundary 50 and are formed inside the p-type well PW1. Herein, the NMOS transistor 1-N1a which is constituted of the diffusion layer DN5 and the channel region (or gate wiring region) GN5 and which allows for less precise control of the threshold voltage compared with the NMOS transistors 1-N4a and 1-N5a so as to perform only the switching operation, may be disposed between the NMOS transistor 1-N5a and the boundary 50 in the p-type well PW1. Thus, it is possible to effectively use the proximate region of the boundary 50 in the p-type well PW1, thus suppressing an increase in the layout area of chips.

In addition, the NMOS transistors 1-N4b and 1-N5b constituted of the diffusion layers DN3 and DN4 and the channel regions (or gate wiring regions) GN3 and GN4 are distanced from the boundary 51 and are formed inside the p-type well PW2. Herein, the NMOS transistor 1-N1b which is constituted of the diffusion layer DN8 and the channel region (or gate wiring region) GN8 and which allow for less precise control of the threshold voltage compared with the NMOS transistors 1-N4b and 1-N5b so as to perform only the switching operation, may be disposed between the NMOS transistor 1-N4b and the boundary 51 in the p-type well PW2. Thus, it is possible to effectively use the proximate region of the boundary 51 in the p-type well PW2, thus suppressing an increase in the layout area of chips.

In the above, the NMOS transistors 1-N4a, 1-N5a, 1-N4b, and 1-N5b which require precise control of threshold voltages are distanced from the boundaries 50 and 51 suffering from uneven impurity density in the p-type wells PW1 and PW2. That is, it is possible to precisely control the threshold voltages of the above NMOS transistors in the center regions of the p-type wells PW1 and PW2 securing uniform impurity density compared to the proximate regions of the boundaries 50 and 51. In this connection, the boundary 50 is formed between the n-type well NW1 and the p-type well PW1, while the boundary 51 is formed between the n-type well NW1 and the p-type well PW2.

Since the NMOS transistors 1-N4a and 1-N5a are distanced from the boundary 50 in the p-type well PW1, and the NMOS transistors 1-N4b and 1-N5b are distanced from the boundary 51 in the p-type well PW2, it is possible to form the NMOS transistors 1-N1a and 1-N1b allowing for less precise control of threshold voltages in the other regions, which can thus be effectively used so as to suppress an increase in the layout area of chips.

Figure 2:
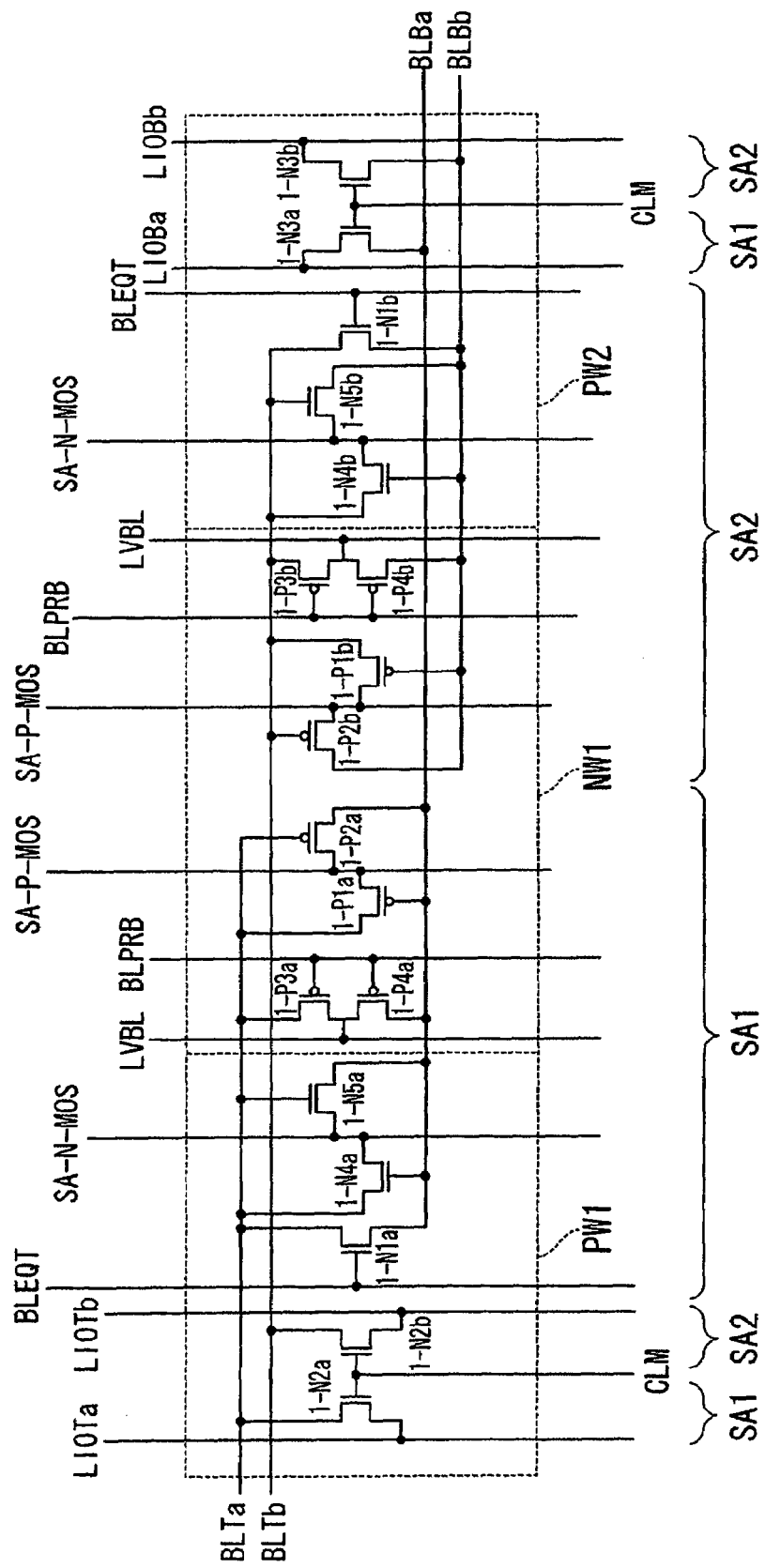
FIG. 2 is a circuit diagram of the sense amplifier circuit shown in FIG. 1.
Figure 3:
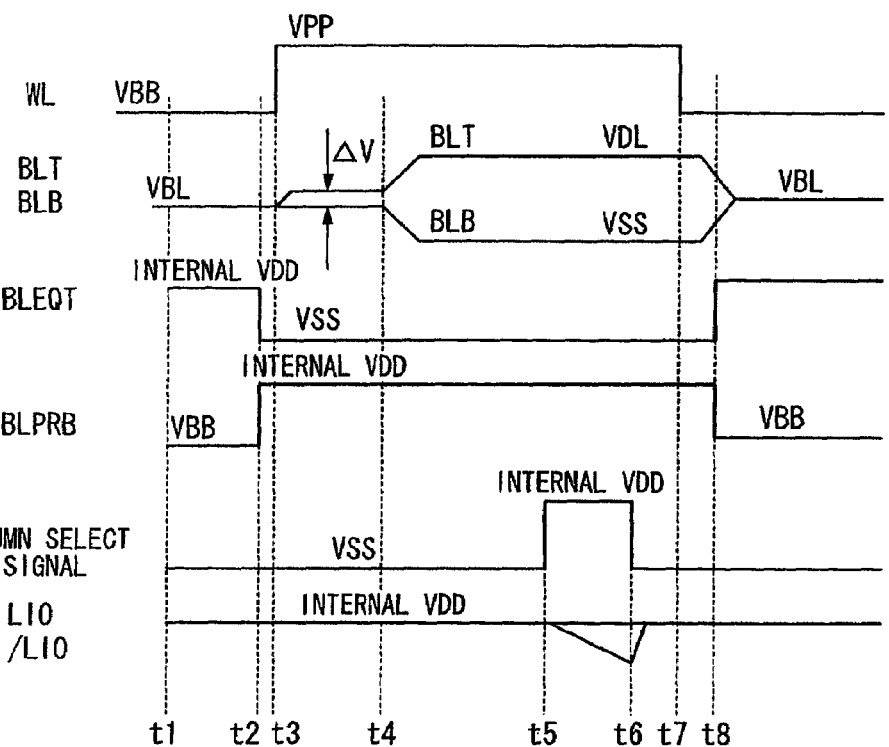
FIG. 3A shows potential variations of a word line WL in the memory mat of FIG. 4.
FIG. 3B shows potential variations of bit lines BLT and BLB in the sense amplifier circuit of FIG. 2.
FIG. 3C shows potential variations of a signal line BLEQT in the sense amplifier circuit of FIG. 2.
FIG. 3D shows potential variations of a signal line BLPRB in the sense amplifier circuit of FIG. 2.
FIG. 3E shows variations of a column-select signal in the sense amplifier circuit of FIG. 2.
FIG. 3F shows potential variations of a local IO line LIO in the sense amplifier circuit of FIG. 2.

FIG. 2 is a circuit diagram showing the constitution of the sense amplifier circuit of FIG. 1, which is adapted to memory cells in a sub-cell array corresponding to a dynamic random-access memory (DRAM).

Memory cells are arranged on both sides of the sense amplifier circuit constituted of the sense amplifiers SA1 and SA2, wherein they are connected with the bit lines BLTa, BLTb, BLBa, and BLBb. Each memory cell is constituted of a switching transistor and a capacitor which is coupled to the corresponding bit lines via the switching transistor. Data "1" or "0" is written in the memory cell in such a way that a charge is accumulated in or discharged from the capacitor via the switching transistor. It is previously described in conjunction with FIG. 5 that the potential difference ΔV, which varies in connection with bit lines, depends upon the amount of charge accumulated in the capacitor.

The sense amplifier SA1's side of the sense amplifier circuit is constituted of the PMOS transistors 1-P1a, 1-P2a, 1-P3a, and 1-P4a and the NMOS transistors 1-N1a, 1-N2a, 1-N3a, 1-N4a, and 1-N5a, wherein the NMOS transistor 1-N3a is disposed in the right side of the sense amplifier SA2.

The sense amplifier SA2's side of the sense amplifier circuit is constituted of the PMOS transistors 1-P1b, 1-P2b, 1-P3b, and 1-P4b and the NMOS transistors 1-N1b, 1-N2b, 1-N3b, 1-N4b, and 1-N5b, wherein the NMOS transistor 1-N2b is disposed in the left side of the sense amplifier SA1.

The sense amplifier SA1 performs sense amplification by use of a pair of the transistors 1-N5a and 1-P2a and a pair of the transistors 1-N4a and 1-P1a, while the sense amplifier SA2 performs sense amplification by use of a pair of the transistors 1-N5b and 1-P2b and a pair of the transistors 1-N4b and 1-P1b.

In the sense amplifier SA1, the source of the PMOS transistor 1-P1a is connected to the node SA-P-MOS, the gate is connected to the bit line BLBa, and the drain is connected to the bit line BLTa, while and the source of the PMOS transistor 1-P2a is connected to the node SA-P-MOS, the gate is connected to the bit line BLTa, and the drain is connected to the bit line BLBa. In the sense amplifier SA2, the source of the PMOS transistor 1-P1b is connected to the node SA-P-MOS, the gate is connected to the bit line BLBb, and the drain is connected to the bit line BLTb, while the source of the PMOS transistor 1-P2b is connected to the node SA-P-MOS, the gate is connected to the bit line BLTb, and the drain is connected to the bit line BLBb.

In the sense amplifier SA1, the drain of the NMOS transistor 1-N4a is connected to the node SA-N-MOS, the gate is connected to the bit line BLBa, and the source is connected to the bit line BLTa, while and the drain of the NMOS transistor 1-N5a is connected to the node SA-N-MOS, the gate is connected to the bit line BLTa, and the source is connected to the bit line BLBa. In the sense amplifier SA2, the drain of the NMOS transistor 1-N4b is connected to the node SA-N-MOS, the gate is connected to the bit line BLBb, and the source is connected to the bit line BLTb, while the drain of the NMOS transistor 1-N5b is connected to the node SA-N-MOS, the gate is connected to the bit line BLTb, and the source is connected to the bit line BLBb.

The sense amplifier SA1 includes the PMOS transistors 1-P1a and 1-P2a which require precise control of threshold voltages in order to amplify a subtle potential difference corresponding to the amount of charge accumulated in the capacitor of the memory cell, while the sense amplifier SA2 includes the PMOS transistors 1-P1b and 1-P2b which require precise control of threshold voltages in order to amplify a subtle potential difference corresponding to the amount of charge accumulated in the capacitor of the memory cell. Compared to the PMOS transistors 1-P3a and 1-P4a which implement only the switching function so as to allow relatively large dispersions of threshold voltages, the PMOS transistors 1-P1a and 1-P2a should be distanced from the boundary 50 in the n-type well NW1. Compared to the PMOS transistors 1-P3b and 1-P4b which implement only the switching functions so as to allow relatively large dispersions of threshold voltages, the PMOS transistors 1-P1b and 1-P2b should be distanced from the boundary 51 in the n-type well NW1.

All the PMOS transistors 1-P3a, 1-P4a, 1-P3b, and 1-P4b are disposed in a direction (Y-direction in FIG. 1) perpendicular to the extending direction of the bit lines (connected with the memory cells), wherein the gates thereof are each connected to the signal line BLPRB. The sources of the PMOS transistors 1-P3a and 1-P3b are both connected to the signal line LVBL while the drains thereof are connected to the bit lines BLTa and BLTb. In addition, the sources of the PMOS transistors 1-P4a and 1-P4b are both connected to the signal line LVBL while the drains thereof are connected to the bit lines BLBa and BLBb. When a precharge-MOS-activate signal of the signal line BLPRB is set to a negative potential (e.g. −0.5 V) in order to precharge the bit lines, the PMOS transistors 1-P3a, 1-P4a, 1-P3b, and 1-P4b whose gates are each supplied with the negative potential are turned on so that the PMOS transistors 1-P3a and 1-P3b precharge the bit lines BLTa and BLTb at the precharge voltage VBL (e.g. 0.6 V) while the PMOS transistors 1-P4a and 1-P4b precharge the bit lines BLBa and BLBb at the precharge voltage VBL.

The sources of the NMOS transistors 1-N1a and 1-N1b are connected to the bit lines BLBa and BLBb, the gates thereof are both connected to the signal line BLEQT, and the drains thereof are connected to the bit lines BLTa and BLTb. When the equalize-MOS-activate signal having a high level (corresponding to the internal drive voltage VDD, e.g. 1.4 V) is supplied to the gates of the NMOS transistors 1-N1a and 1-N1b via the signal line BLEQT, the NMOS transistors 1-N1a and 1-N1b are turned on so as to equalize the bit lines BLTa, BLTb, BLBa, and BLBb with the precharge voltage VBL. At this time, the drive voltage is not supplied to the nodes SA-P-MOS and SA-N-MOS, which are thus equalized to the precharge voltage VBL.

In the above, the precharge-MOS-activate signal of the signal line BLPRB is inverse to the equalize-MOS-activate signal of the signal line BLEQT.

The drains of the NMOS transistors 1-N2a and 1-N2b are connected to the bit lines BLTa and BLTb, the gates thereof are both connected to a signal line CLM, and the sources thereof are connected to the local IO lines LIOTa and LIOTb.

The drains of the NMOS transistors 1-N3a and 1-N3b are connected to the bit lines BLBa and BLBb, the gates thereof are both connected to the signal line CLM, and the sources thereof are connected to the local IO lines LIOBa and LIOBb.

When a column-select signal having a high level is applied to the signal line CLM, the NMOS transistors 1-N2a, 1-N3a, 1-N2b, and 1-N3b are turned on, so that the bit lines BLTa and BLTb are connected to the local IO lines LIOTa and LIOTb, while the bit lines BLBa and BLBb are connected to the local IO lines LIOBa and LIOBb.

Next, the operation of the sense amplifier circuit will be described in detail with reference to FIG. 2 and FIGS. 3A to 3F. FIGS. 3A to 3F show the waveforms of signals used in the sense amplifier circuit of FIG. 2. The following description is given with respect to the read operation for reading data from the memory cell connected with the bit line BLTa, wherein the memory cell stores data "1" in advance. That is, the following description refers to only the operation of the sense amplifier SA1, wherein the sense amplifier SA2 handling signals similar to those of the sense amplifier SA1 operates in a similar way as the sense amplifier SA1.

At time t1, the precharge voltage (e.g. 0.6 V) is applied to the signal line LVBL while the precharge-MOS-activate signal having a negative potential VBB (e.g. −0.5 V) is applied to the gates of the PMOS transistors 1-P3a and 1-P4a via the signal line BLPRB, so that the PMOS transistors 1-P3a and 1-P4a are turned on so as to precharge the bit lines BLTa and BLBa at the precharge voltage VBL. At this time, the BL-equalize-MOS-activate signal having a high level (corresponding to the internal drive voltage VDD, e.g. 1.4 V) is supplied to the gate of the NMOS transistor 1-N1a via the signal line BLEQT, so that the NMOS transistor 1-N1a is turned on so as to equalize the bit lines BLTa and BLBa to the precharge voltage VBL. Herein, the drive voltage is not supplied to the nodes SA-N-MOS and SA-P-MOS, which are thus equalized to the precharge voltage VBL.

At time t2, a high level (corresponding to the internal drive voltage VDD) is applied to the signal line BLPRB while a low level (corresponding to the ground potential VSS) is applied to the signal line BLEQT, so that the NMOS transistor 1-N1a and the PMOS transistors 1-P3a and 1-P4a are turned off so as to set the bit lines BLTa and BLBa to an open state in which the levels thereof are maintained at the precharge voltage VBL.

At time t3, the word line WL connected to the memory cell connected with the bit line BLTa is activated and is set to a high level VPP (e.g. 2.7 V), so that a switching transistor (or an NMOS transistor, not shown) is turned on so as to transfer a charge accumulated in the capacitor of the memory cell onto the bit line BLTa, which is thus increased in potential by ΔV (corresponding to the transferred charge). Since the bit line BLBa is maintained at the precharge voltage VBL, the potential difference ΔV occurs between the bit lines BLTa and BLBa.

At time t4, the node SA-N-MOS is set to the ground potential VSS while the node SA-P-MOS is set to VDL (e.g. 1.2 V), so that compared to the PMOS transistor 1-P2a with the gate connected to the bit line BLTa, the PMOS transistor 1-P1a with the gate connected to the bit line BLBa whose potential is lower than the bit line BLTa by ΔV is first turned on with a relatively small on-resistance.

Compared to the NMOS transistor 1-N4a with the gate connected to the bit line BLBa, the NMOS transistor 1-N5a with the gate connected to the bit line BLTa whose level is higher than the bit line BLBa by ΔV is first turned on with a relatively small on-resistance.

The above operation increases the level of the bit line BLTa while decreasing the level of the bit line BLBa; finally, the level of the bit line BLTa matches the voltage VDL of the node SA-P-MOS while the level of the bit line BLBa matches the ground potential VSS, thus completing the sense amplification on ΔV.

At time t5, the column-select signal of the signal line CLM is set to a high level (corresponding to the internal drive voltage VDD), so that the NMOS transistor 1-N2a is turned on so as to connect the bit line BLTa to the local IO line LIOTa so that the voltage VDL of the bit line BLTa subjected to amplification is output to the local IO line LIOTa, while the NMOS transistor 1-N3a is turned on to as to connect the bit line BLBa to the local IO line LIOBa so that the potential VSS of the bit line BLBa subjected to amplification is output to the local IO line LIOBa.

At time t6, the column-select signal of the signal line CLM is set to a low level (corresponding to the ground potential VSS), whereby the NMOS transistor 1-N2a is turned off so as to disconnect the local IO line LIOTa from the bit line BLTa, while the NMOS transistor 1-N3a is turned off so as to disconnect the local IO line LIOBa from the bit line BLBa.

At time t7, the word line WL is set to a low level (corresponding to the ground potential VSS), whereby the switching transistor of the memory cell is turned off so as to disconnect the memory cell performing the read operation from the bit line BLTa.

In order to continue the read operation of the memory cell after time t8, a series of operations at times t1 to t7 is repeated.

Since the present embodiment is designed based on the consideration of the layout of transistors of sense amplifiers in a well, it is possible to reliably form the PMOS transistors 1-P1a, 1-P2a, 1-P1b, and 1-P2b requiring precise control of threshold voltages, wherein it is possible to minimize dispersions of threshold voltages between the PMOS transistors 1-P1a and 1-P2a and dispersions of threshold voltages between the PMOS transistors 1-P1b and 1-P2b. This allows the sense amplifiers SA1 and SA2 to sense and amplify the "subtle" potential difference ΔV; thus, it is possible to improve the precision in reading data from memory cells without increasing the overall layout area of chips.

Next, the constitution and operation of the semiconductor device using the sense amplifier circuit shown in FIGS. 1 and 2 will be described with reference to FIG. 4, which is a block diagram showing the constitution of the semiconductor device using the sense amplifier circuit of the present embodiment. The semiconductor device serves as a synchronous dynamic random-access memory (SDRAM).

Figure 4:
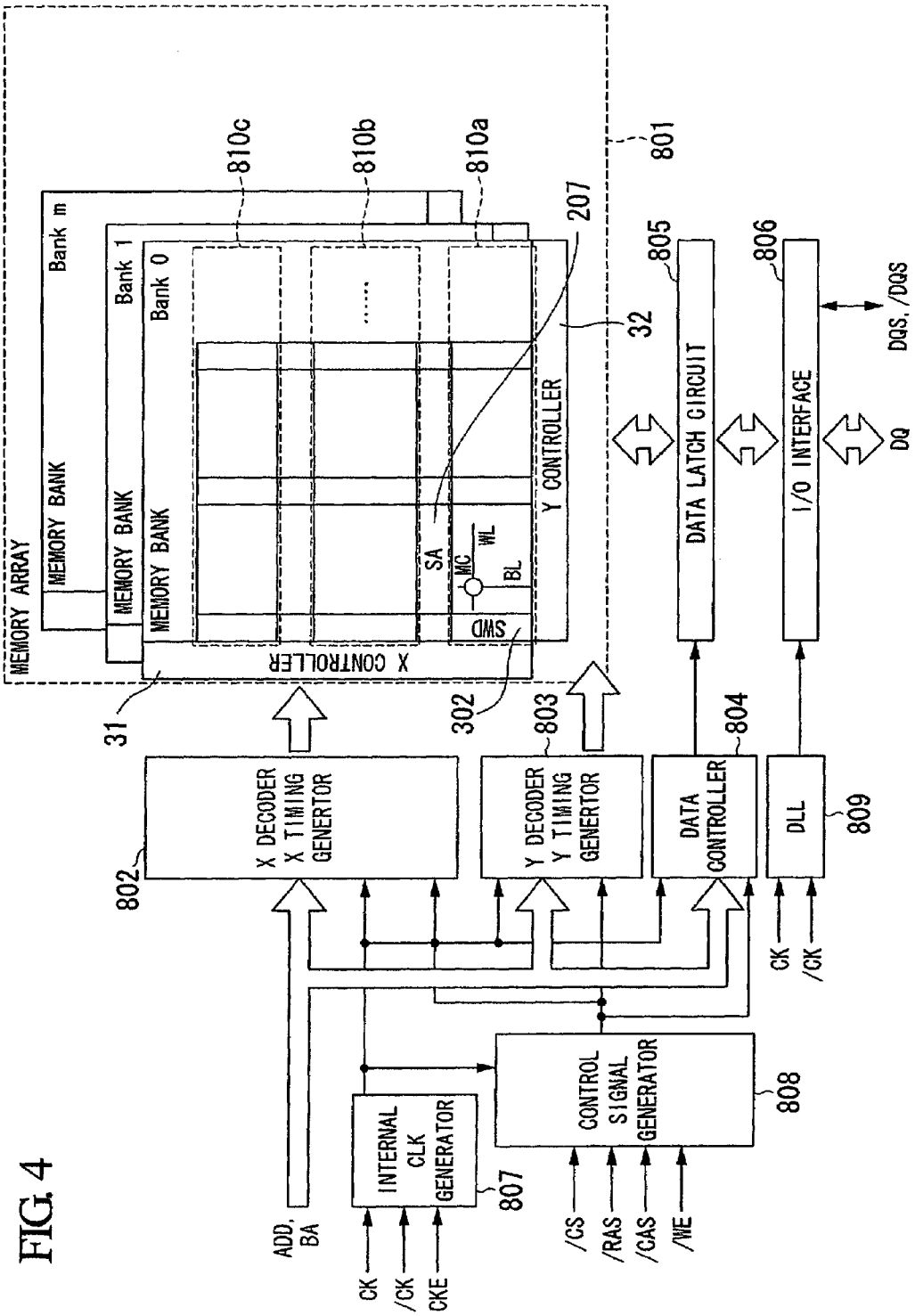
FIG. 4 is a block diagram showing the constitution of a semiconductor device using the sense amplifier circuit of FIG. 2.
Figure 5:
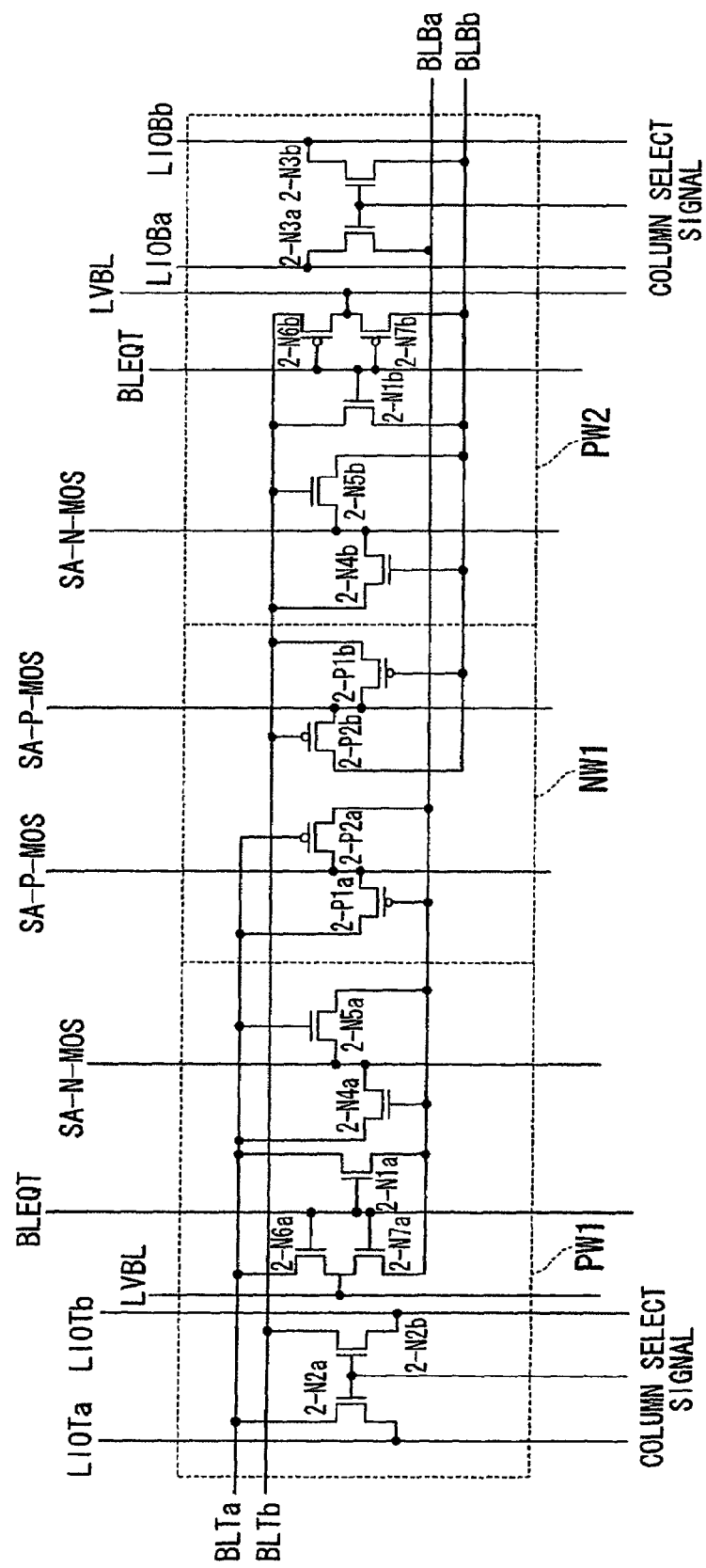
FIG. 5 is a circuit diagram showing an example of a sense amplifier circuit coupled with memory cells in adjacent memory mats and fabricated in well regions.

The semiconductor device of FIG. 4 is constituted of an internal clock (CLK) generator 807, a control signal generator 808, an X-decoder/X-timing-generator 802, a Y-decoder/Y-timing-generator 803, a data controller 804, a delay locked loop (DLL) 809, a memory array 801, a data latch circuit 805, and an input/output (I/O) interface 806.

The memory array 801 includes a plurality of memory banks Bank_0 to Bank_m, each of which includes an X controller 31, a Y controller 32, a plurality of sub-word drivers (SWD) 302, a plurality of sense amplifier strings (SA) 207, and a plurality of memory mat strings 810*a*, 810*b*, 810*c*, . . . . Each of the memory mat strings 810*a*, 810*b*, 810*c*, . . . includes a plurality of memory mats, each of which further includes a plurality of memory cells. The sense amplifier string 207 includes a plurality of sense amplifier circuits 203, each of which corresponds to the sense amplifier circuit of the present embodiment.

In the semiconductor device of FIG. 4, the X-decoder/X-timing-generator 802 decodes row addresses (or X-addresses) of address signals ADD output from an external device (not shown), while the Y-decoder/Y-timing-generator 803 decodes column addresses (or Y-addresses) of address signals ADD. Based on decoding results, the semiconductor device selects word line WL and bit lines BL (e.g. BTLa, BLTb, BLBa, and BLBb) laid in the memory banks Bank_0 to Bank_m of the memory array 801, thus reading data from or writing data into memory cells MC disposed at intersecting points between the selected word lines WL and bit lines BL via the sense amplifier circuits 203 of the sense amplifier strings 207 and the local IO lines (e.g. paired lines of LIOTa and LIOBa and paired lines of LIOTb and LIOBb). The I/O interface 806 is synchronized with external clock signals via the DLL 809 so as to output read data to the external device or to input write data from the external device. The aforementioned circuit elements operates based on internal clock signals which are generated by the internal clock generator 807 based on external clock signals.

By use of the sense amplifier circuit of the present embodiment, it is possible to improve the precision of reading data from memory cells in the semiconductor device.

As described heretofore, the present invention is designed based on the discovery that impurity density of a well subjected to ion implantation is dispersed due to reflection of impurity at side wall of a photoresist layer, thus affecting operational characteristic parameters of prescribed elements due to dispersion of impurity density in the well. The present invention provides a novel technology in which sensitive element sensitive to dispersion of impurity density in the well is distanced from a boundary and disposed inside wells, while non-sensitive element is disposed in the proximity of boundary in the well.

Lastly, it is apparent that the present invention is not limited to the above embodiments, but may be modified and changed without departing from the scope and spirit of the invention.

What is claimed is:

1. A semiconductor device comprising a sensitive element and a non-sensitive element formed in a first-conductivity-type well, wherein the sensitive element, which is relatively sensitive to dispersion of impurity density of the first-conductivity-type well, is distanced from a boundary of the first-conductivity-type well, and wherein the non-sensitive element, which is not relatively sensitive to dispersion of impurity density of the first-conductivity-type well, is disposed in proximity to the boundary of the first-conductivity-type well.

2. The semiconductor device according to claim 1, wherein the boundary is in a rectangle.

3. The semiconductor device according to claim 1, wherein the sensitive element comprising a second-conductivity-type semiconductor layer is distanced from the boundary, and wherein the non-sensitive element comprising the second-conductivity-type semiconductor layer is disposed in proximity to the boundary.

4. The semiconductor device according to claim 1, wherein the non-sensitive element is disposed between the sensitive element and the boundary.

5. The semiconductor device according to claim 1, wherein each of the sensitive element and the non-sensitive element is configured of MOS transistor.

6. The semiconductor device according to claim 5, wherein the sensitive element requires precision control of a threshold voltage thereof, and wherein the non-sensitive element allows for a less precise control of a threshold voltage thereof.

7. A semiconductor device comprising:
a plurality of memory cells; and
a sense amplifier circuit for amplifying a potential difference occurring between bit lines due to a read operation for reading data from the memory cell,
the sense amplifier circuit including a plurality of precharge MOS transistors which are each constituted of a second-conductivity-type semiconductor layer and are formed in a first-conductivity-type well so as to precharge the bit lines before the read operation, and a plurality of sense-amplification MOS transistors which are each constituted of the second-conductivity-type semiconductor layer and are formed in the first-conductivity-type well so as to amplify the potential difference occurring between the bit lines due to the read operation,
wherein the precharge MOS transistors are disposed in proximity to a boundary of the first-conductivity-type well, and
wherein the sense-amplification MOS transistors are distanced from the boundary of the first-conductivity-type well.

8. The semiconductor device according to claim 7, wherein the boundary is in a rectangle.

9. The semiconductor device according to claim 7, wherein the first-conductivity-type is n-type and the second-conductivity-type is p-type, and wherein gates of the precharge MOS transistors are each supplied with negative potential during the precharge of the bit lines.

10. A semiconductor device comprising:
a plurality of memory cells; and
a sense amplifier circuit for amplifying a potential difference occurring between bit lines due to a read operation for reading data from the memory cell,
the sense amplifier circuit including a equalize-MOS transistor which is constituted of a second-conductivity-type semiconductor layer and is formed in a first-conductivity-type well so as to equalize the bit lines to the same potential during precharge of the bit lines, and a plurality of sense-amplification MOS transistors which are each constituted of the second-conductivity-type semiconductor layer and are formed in the first-conductivity-type well so as to amplify the potential difference occurring between the bit lines due to the read operation,
wherein the equalize-MOS transistor is disposed in proximity to a boundary of the first-conductivity-type well, and wherein the sense-amplification MOS transistors are distanced from the boundary of the first-conductivity-type well.

11. The semiconductor device according to claim 10, wherein the boundary is in a rectangle.

* * * * *